United States Patent
Maejima et al.

[11] Patent Number: 5,347,709
[45] Date of Patent: Sep. 20, 1994

[54] METHOD OF MAKING LEAD FRAME

[75] Inventors: Yoshihisa Maejima; Seiya Nishimura; Masayoshi Takabayashi; Tokuyoshi Ohta, all of Hamamatsu, Japan

[73] Assignee: Yamaha Corporation, Hamamatsu, Japan

[21] Appl. No.: 74,044

[22] Filed: Jun. 8, 1993

Related U.S. Application Data

[63] Continuation-in-part of Ser. No. 872,014, Apr. 22, 1992, abandoned.

[51] Int. Cl.$^5$ .............................................. H01R 43/00
[52] U.S. Cl. ....................... 29/827; 174/52.2; 437/207; 437/217; 437/220
[58] Field of Search ............... 432/217, 220, 207; 174/52.2; 29/827

[56] References Cited

U.S. PATENT DOCUMENTS

| | | | |
|---|---|---|---|
| 3,524,249 | 8/1970 | Hamada | 437/217 |
| 4,079,511 | 3/1978 | Grabbe | 174/52.2 X |
| 4,214,364 | 7/1980 | St. Louis et al. | 174/52.2 X |
| 4,396,140 | 8/1983 | Jaffe et al. | |
| 4,466,183 | 8/1984 | Burns | 174/52.5 X |
| 4,490,902 | 1/1985 | Eytcheson et al. | 437/220 |
| 4,657,172 | 4/1987 | Lee | |
| 4,720,034 | 1/1988 | Lee | |
| 4,722,470 | 2/1988 | Johary | |
| 4,759,491 | 7/1988 | Fisher | |
| 4,761,880 | 8/1988 | Stankus et al. | |
| 4,803,540 | 2/1989 | Moyer et al. | |
| 4,977,442 | 12/1990 | Suzuki et al. | |
| 5,070,039 | 12/1991 | Johnson et al. | 437/207 |
| 5,254,500 | 10/1993 | AuYeung | 437/220 X |

FOREIGN PATENT DOCUMENTS 0330512 8/1989 European Pat. Off. .
2027990 2/1980 United Kingdom .

OTHER PUBLICATIONS

IBM Technical Disclosure Bull. vol. 29 No. 6 Nov. 1986 pp. 2486–2487.

*Primary Examiner*—Carl J. Arbes
*Attorney, Agent, or Firm*—Spensley Horn Jubas & Lubitz

[57] ABSTRACT

A lead frame at least provides a semiconductor-element-mounting portion, plural leads and plural auxiliary leads. The auxiliary leads are arranged to be associated with plural leads, while a tie bar is provided and connected among the leads. According to a method of making the lead frame, an IC-chip mounting process, a wire-bonding process, a sealing process, a resin-cutting process and a dambar-cutting process are sequentially effected on the lead frame. After effecting the dambar-cutting process, a thin-plating process is effected so as to form a thin-plated layer, approximately having a thickness of 5 μm to 15 μm, on the leads. Then, the leads are bent by a predetermined bending process. Thereafter, a thick-plating process is effected so as to form an uniform thick-plated layer, approximately having a thickness of 15 μm to 100 μm, on the leads. After effecting the thick-plating process, a trimming process is effected on the leads. Incidentally, the thin-plating process can be effected after the bending process and before the thick-plating process.

8 Claims, 9 Drawing Sheets 5,347,709

METHOD OF MAKING LEAD FRAME

This is a continuation-in-part of application Ser. No. 07/872,014, filed Apr. 22, 1992, now abandoned.

BACKGROUND OF THE INVENTION

FIELD OF THE INVENTION

The present Invention relates to a method of making a lead frame which is used for semiconductor devices such as a semiconductor integrated circuit (IC).

PRIOR ART

It is conventionally demanded that in a semiconductor device such as an IC, a highly-reliable and low-cost IC-mounting method is developed. In response to a recent tendency in which the circuit-integration scale of the semiconductor IC is enlarged, the IC package which contains it must be designed to provide a large number of pins and consequently a narrow pitch between the pins. However, even advanced precision soldering techniques cannot keep with such accelerated large-scaling tendencies of the semiconductor IC.

In short, when soldering the terminals of an IC having a large number of pins and a narrow pitch between the pins, it is extremely difficult to constantly supply a predetermined amount of the soldering flux to the fine soldering portion of the IC. Conventionally, these integrated circuits are mainly soldered by hand.

In such hand soldering, when supplying the soldering flux to the fine soldering portion, there is a drawback in that the amount of the soldering flux supplied cannot be fixed. Thus, when the amount of the soldering flux supplied is smaller than the required amount, the soldered joint portion may lack joint strength. On the other hand, when the amount supplied is excessive, the adjacent terminals must be connected together by a bridge portion formed by excessive amounts of soldering flux so that a short circuit is formed.

In order to cope with such drawbacks, there is provided another IC-mounting method for mounting the above-mentioned kind of semiconductor device onto a substrate. According to this method, the leads of the IC are subjected to solder plating in advance, for example. Then, when effecting the soldering operation so as to mount and electrically connect the IC to the substrate, the soldering flux provided by the external equipment is supplied to the joint portion.

In the above-mentioned method, the solder plating which is pre-effected at the terminals of the semiconductor device is employed to improve a leak-free joint against the soldering flux provided by the external equipment. Herein, such solder plating is made in a thickness of some micro-meters. However, such thin solder-plated layer cannot offer sufficient joint strength. For this reason, the soldering operation is performed by supplying the soldering flux from the external equipment in a manner which compensates for the lack of the joint strength, in accordance with the following method.

As the supply method for the soldering flux, four methods are provided as follows. In a first method, the soldering flux is supplied by use of thread soldering flux. In a second method, soldering paste is painted, in advance, on the pad of the substrate by screen printing. In a third method, soldering paste is painted on the pad of the substrate by use of a dispenser. In In a fourth method, the substrate is soaked in a bath of the soldering flux.

In the case of the so-called QFP-type IC package having many pins and providing a narrow pitch between the leads, such lead-pitch may be designed to be 0.65 mm or less, for example. In this case, even when employing the foregoing methods, if the amount of the soldering flux supplied is slightly excessive, the foregoing bridge portion made of the excessive soldering flux is formed between the leads after the re-flow (or dissolution) of the soldering flux. On the other hand, if the supplied amount is slightly less than the required amount, adequate joint strength cannot be obtained. For this reason, it is also quite difficult to supply an accurate amount of the soldering flux to the fine soldering portion.

FIG. 1 illustrates a tool 1 which is used to effect electric-solder plating on a large number of leads 6 (FIG. 2) provided in a QFP-type IC package having a large number of pins. This tool 1 is comprised of an upper frame 3, a lower frame 2 and screws 4. Herein, both of the frames 2 and 3 have a square shape, and the upper frame 3 Is made of brass, while the lower frame 2 is made of a non-conductive substance.

As shown in FIG. 2, a main portion 5 of the QFP-type IC package having a large number of pins is provided between the lower frame 2 and the upper frame 3. Herein, the frames 2 and 3 are joined together by the screws 4 such that leads 6 of the main portion 5 are sandwiched between them. The tool 1 is soaked in a solder-plating bath A so that many of the leads 6 are soaked. By connecting the tool 1 to a power supply cathode while connecting a solder ingot 7 to an anode of the power supply, the electroplating is carried out.

When effecting solder-plating on the leads of the QFP-type IC, the arrangement of the leads may lack uniformity at the four corners of the QFP-type IC. This causes the plating thickness of the leads positioned in the vicinity of the above four corners to be larger than that of the other leads. Thus, when mounting the QFP-type IC on a printed substrate, there is a drawback in that a short circuit may occur among the leads, positioned in the vicinity of four corners of the IC, by the bridge portion to be formed on these leads. Due to the nonuniform plating thickness of the leads, there occurs another drawback in that the mounting strength of the QFP-type IC is unstable. In the case of the IC packages other than the above-mentioned QFP-type IC package, if the pitch between the leads is nonuniform, the plating thickness at such leads may be altered.

Next, description will be given of another example of a conventional lead frame with reference to FIGS. 3 and 4. FIG. 3 is a plan view illustrating the general configuration of a corner portion of a conventional lead frame. Herein, plural leads 22 are arranged around a semiconductor-element-mounting-portion 21, wherein tip-edge portions thereof are connected together by tie bars 23. In addition, base-edge portions of the leads 22 are connected with respective sides of the semiconductor-element-mounting-portion 21 by dams 24. The semiconductor element (not shown) is mounted on the semiconductor-element-mounting-portion 21. Then, the semiconductor element is connected with the base-edge portions of the leads 22 by a wire-bonding process, and thereafter, a molding process is carried out.

FIG. 4(a) is a perspective view illustrating a lead frame with which a molding process has been used, wherein 25 designates a mold resin portion in which a semiconductor element is molded. As illustrated in FIG. 4(a), plural lead frames are sequentially formed. In this state, a resin-cutting process is carried out so as to remove the unnecessary molding materials from the lead frame; and a dambar-cutting process is carried out so as to cut the dams 24 down. In this manner, the state of the lead frame shown in FIG. 4(a) is changed to the next state shown in FIG. 4(b). In such state, a plating process Is carried out using soldering flux, tin, rare metal and the like. Next, as shown in FIG. 4(c), a bending process is carried out with respect to the leads 22. Thereafter, the lead frame is removed, thus completing the entire process of forming the lead frame.

In the above-mentioned process, the leads 22 are subjected to the bending process after effecting the metal-plating process. Therefore, when bending the leads 22, the plated surface thereof may be contacted with and rubbed by the mold surface, so that flaws and cracks may occur on the leads 22. Such problems spoil the appearance of the lead frame, and it also affects the soldering process to be made when mounting the semiconductor element.

In order to cope with such problem, we have proposed a new processing method in which the plating process is carried out after effecting the bending process. However, a conventional lead frame is produced under the precondition that the bending process is carried out after effecting the plating process. For this reason, even in the above-mentioned new processing method, when effecttng the bending process, each of the leads must be separated, or each side of the mold resin portion must be electrically separated from the other sides. Therefore, it is required that the power supply must be applied with respect to each lead or leads at each side, which complicates the plating process. For example, when effecting the bending process on the lead frame as shown in FIG. 3, a branch portion "a" must be separated from the leads 22, so that each side must be electrically independent from the other sides of the semiconductor-element-mounting-portion 21. This means that if the stay-type branch portion "a" extending from a peripheral frame branch portion 26 is not cut down, the bending process cannot be carried out on the leads 22.

SUMMARY OF THE INVENTION

It is accordingly a primary object of the present invention to provide a method of making a lead frame in which the solder plated layer having an even thickness can be electrically deposited on all of the leads.

It is another object of the present invention to provide a method of making a lead frame in which flaws and cracks are easily prevented from being formed on the leads.

The present invention discloses a method of making a lead frame at least providing a semiconductor-element-mounting portion, plural leads and plural auxiliary leads. The auxiliary leads are arranged to be associated with plural leads, while a tie bar is provided and connected among the leads. According to a method of making the lead frame, an IC-chip mounting process, a wire-bonding process, a sealing process, a resin-cutting process and a dambar-cutting process are sequentially effected on the lead frame. After effecting the dambar-cutting process, a bending process is effected on the leads so as to bend them. Thereafter, a plating process is effected so as to form an uniform plated layer on the leads. After effecting the plating process, a trimming process is effected on the leads.

Since the plating process is effected after effecting the bending process, the thickness of the plated layer formed on the leads can be easily controlled to be uniform.

BRIEF DESCRIPTION OF THE DRAWINGS

Further objects and advantages of the present invention will be apparent from the following description, reference being had to the accompanying drawings wherein the preferred embodiments of the present invention are clearly shown.

In the drawings.

DESCRIPTION OF THE PREFERRED EMBODIMENTS

The mechanical structure of the lead frame is discussed in detail in U.S. patent application Ser. No. 08/073,893 filed currently herewith, the disclosure of which is incorporated herein by reference.

[A] First Embodiment

Figure 5:
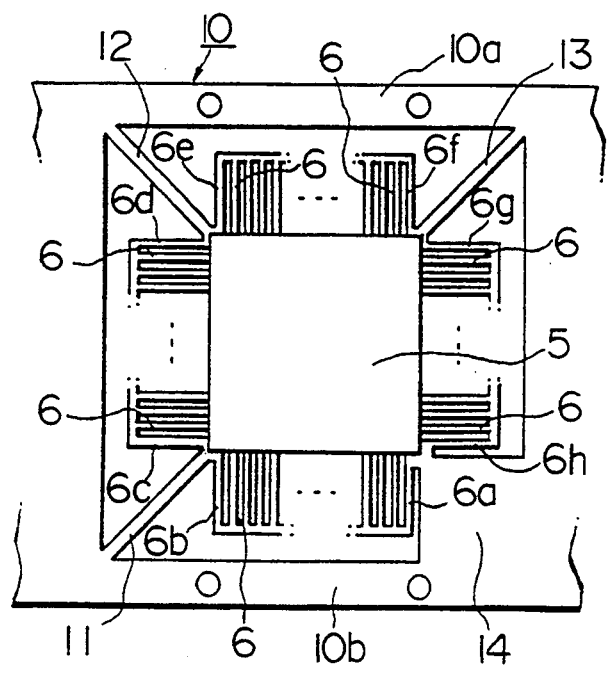
FIG. 5 is a plan view illustrating a semiconductor IC using a lead frame according to a first embodiment of the present invention.

FIG. 5 is a plan view illustrating a semiconductor IC employing a QFP-type lead frame 10 according to the first embodiment of the present invention. In FIG. 5, a semiconductor chip is mounted on the island (not shown, i.e., semiconductor-chip-mounting-portion) of the lead frame 10; the wire-bonding is made between the leads 6 and electrode pads of the semiconductor chip; and the main portion 5 is formed by the mold resin. At the outside portions of eight leads 6 which are arranged near four corner-portions of the QFP-type IC package, there are further provided eight auxiliary leads 6a to 6h which are not connected with the electrode pads of the semiconductor chip. Herein, the space between each of the auxiliary leads 6a–6h and its adjacent lead 6 is made identical to the space between two adjacent leads 6. As for the leads 6 positioned in the vicinity of four corner-portions, in similar fashion to the other leads 6, the same space is provided between two adjacent leads. In FIG. 5, the tip-edge portions of the auxiliary leads 6a, 6b and leads 6, which are arranged along the lower side of the square-shaped main portion 5, are connected with each other. The same connection is made with respect to the other leads which are respectively arranged along the other sides of the main portion 5. In short, in each side of the main portion 5, two auxiliary leads are connected together with the leads, which are sandwiched thereby at their tip-edge portions, so that the auxiliary leads are not positioned apart from the leads 6. In addition, the base-edge portions of the auxiliary leads 6b, 6c are connected with a peripheral frame 10b via a connecting portion 11, while the base-edge portions of the auxiliary leads 6d, 6e are connected with another peripheral frame 10a via a connecting portion 12. Similarly, the base-edge portions of the auxiliary leads 6f and 6g are connected with the peripheral frame 10a via a connecting portion 13, while the base-edge portions of the auxiliary leads 6h and 6a are connected with the peripheral frame 10b via a mold resin gate 14. In short, all of the leads 6 and auxiliary leads 6a to 6h are electrically connected together such that the short circuit may be formed among them.

Figure 6:
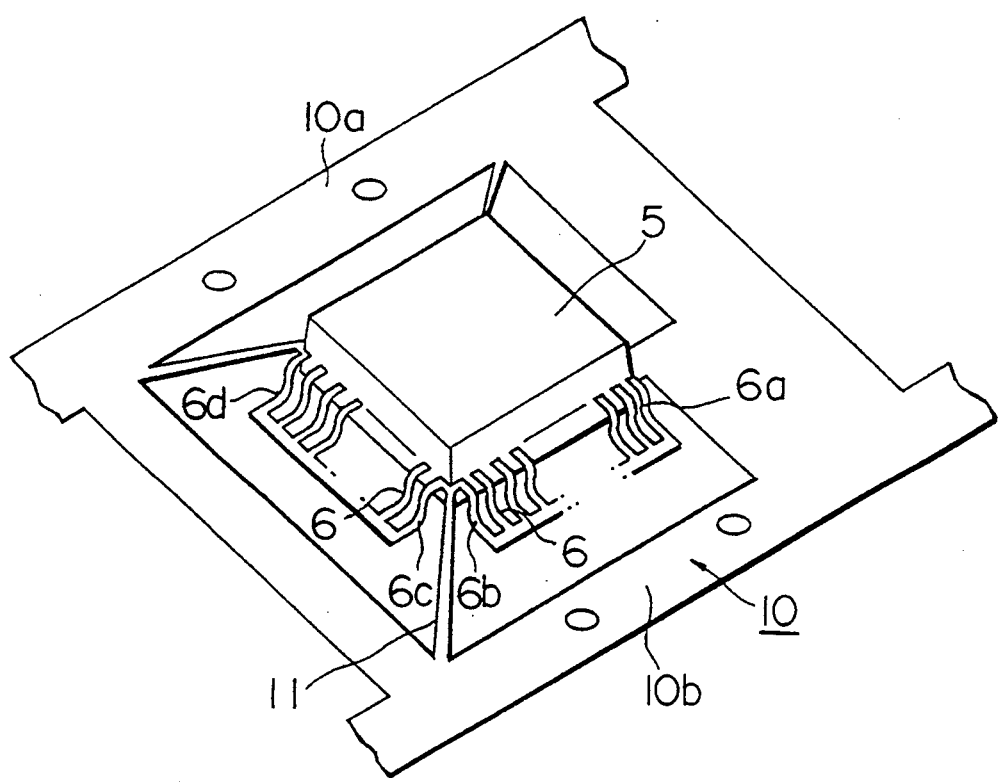
FIG. 6 is a perspective view Illustrating the semiconductor IC to which the lead-forming process has been applied.

Before effecting the solder-plating process by which the solder-plated layer having the relatively large thickness is to be formed, the lead forming process is made, so that as shown in FIG. 6, the leads 6 and auxiliary leads 6a to 6h are respectively bent to be formed in the predetermined shapes. Thereafter, the power supply cathode is connected to the lead frame 10, while the anode of the power supply is positioned to face with the leads 6 and auxiliary leads 6a to 6h. In such state, the lead frame 10 is soaked in the electric-plating solution so as to effect the electric-plating process. As a result, the solder-plated layer is electrically deposited at the leads 6 and auxiliary leads 6a to 6h. In this case, the plating thickness at the auxiliary leads 6a to 6h, which are arranged near the corner-portions of the main portion 5, must be larger than the plating thickness at the other leads 6. However, the even plating thickness can be provided at all of the leads 6 other than the auxiliary leads 6a to 6h. In order to shorten the time of the solder-plating process, the electric-plating solution is stirred and/or heated.

After completing the solder-plating process, the tip-edge portions of the leads 6 and auxiliary leads 6a to 6h are cut down, so that all of the leads 6 and 6a to 6h are separated from each other at their tip-edge portions. In this cutting process, the connecting portions 11 to 13 and mold resin gate 14 are respectively cut down so that they are separated from the main portion 5. As a result, the semiconductor IC is separated from the lead frame 10, wherein the semiconductor IC provides the leads 6 only at four sides of the main portion 5 respectively. Thus, it is possible to provide a the semiconductor IC in which the solder-plated layer is formed evenly at all of the leads, and in a relatively large thickness.

[B] Second Embodiment (1) Construction

Figure 7:
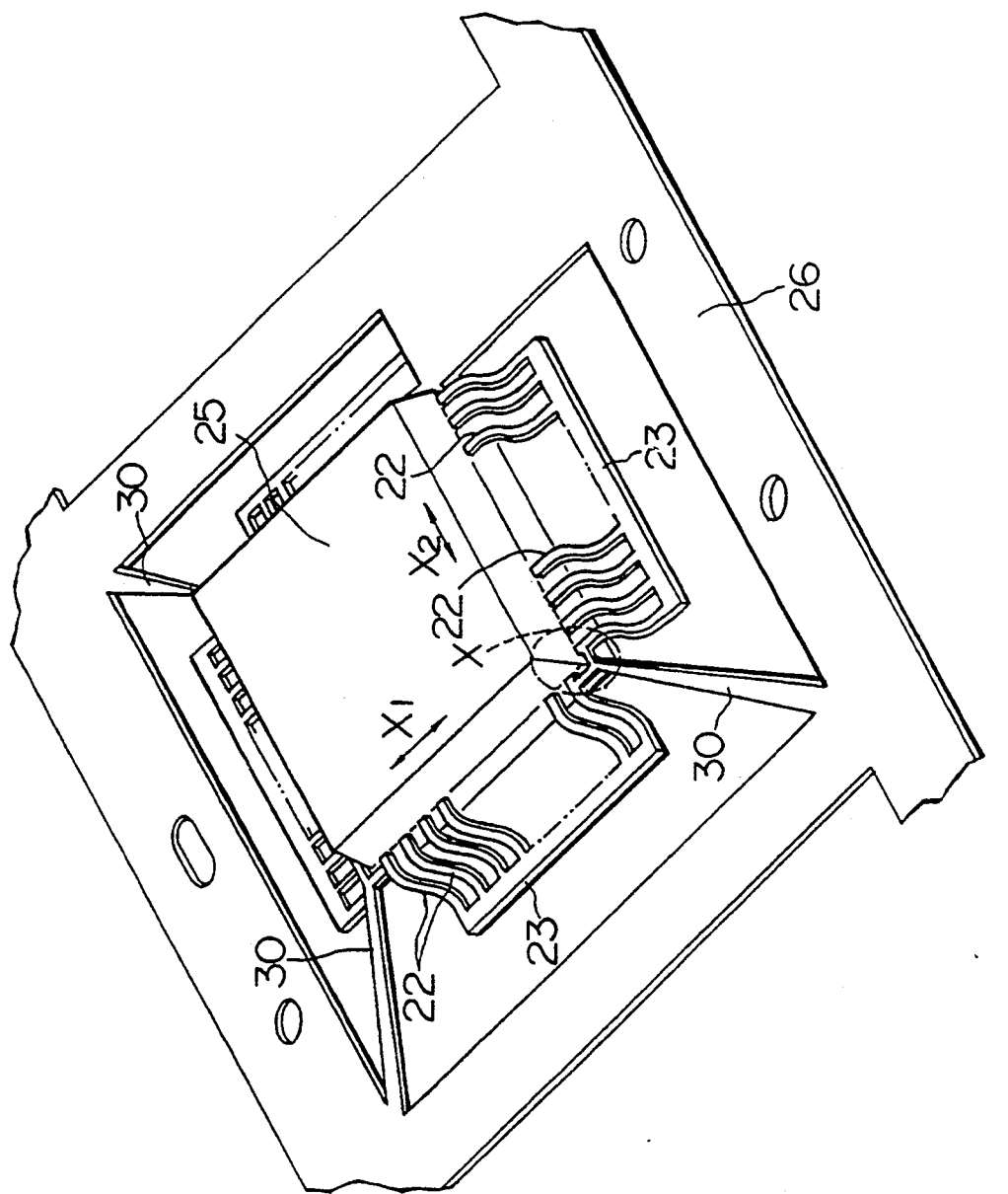
FIG. 7 is a perspective view illustrating a lead frame according to a second embodiment of the present invention.
Figure 8:
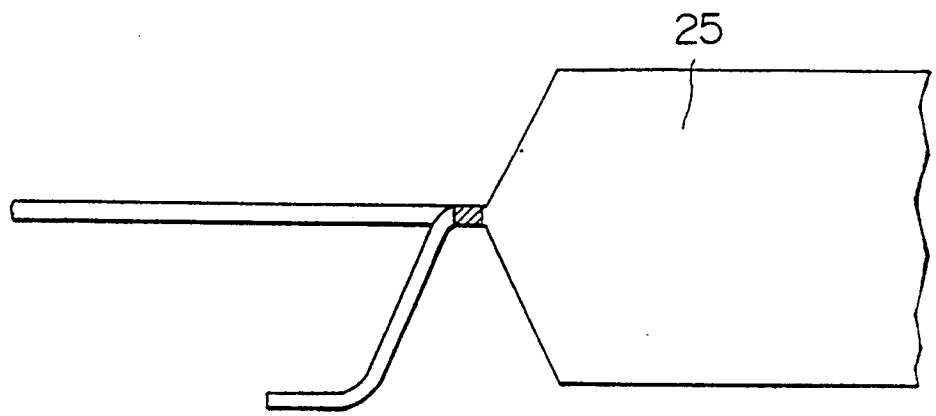
FIG. 8 is a sectional view showing the main portion of the lead frame according to the second embodiment.

FIG. 7 is a perspective view Illustrating the lead frame according to the second embodiment of the present invention, while FIG. 8 is a sectional view showing the lead frame. These drawings correspond to the state where the frame-bending process has been completed.

In FIGS. 7 and 8, a numeral 30 designates a support-stay portion having a base-edge portion which Is formed in a V-shape (see portion "X" surrounded by a dotted line in FIG. 7). Herein, a first branch portion of the V-shaped support-stay portion 30 is connected with the base-edge portion of a right-most lead within a plurality of leads arranged along an X1 side, while a second branch portion of the support-stay portion 30 is connected with the base-edge portion of a left-most lead within a plurality of leads arranged along an X2 side. Such connection manner can be maintained even when the foregoing bending process is carried out. As shown in FIG. 8, each lead 22 is bent at a position extending from the base-edge portion thereof. Therefore, the V-shaped portion of the support-stay portion 30 is not bent in this process. For this reason, the support-stay portion 30 is not separated from the leads 22.

In addition, the leads 22 arranged along each side of the mold resin portion 25 are connected together by the tie bar 23 so that the current-conduction relationship is established among them. Therefore, it is possible to conduct a current through all of the leads via the peripheral frame portion 26. Thus, it is possible to perform the current-conduction for the metal-plating process with ease.

(2) Processing Method

FIGS. 9(a) to 9(e) are perspective views illustrating the processing method for the lead frame according to the second embodiment.

Figure 4:
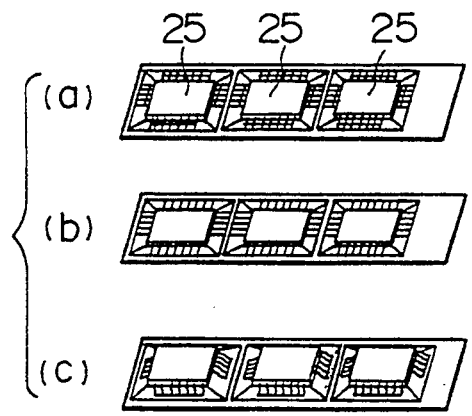
FIGS. 4(a) to 4(c) show a processing method of processing the conventional lead frame.
Figure 9:
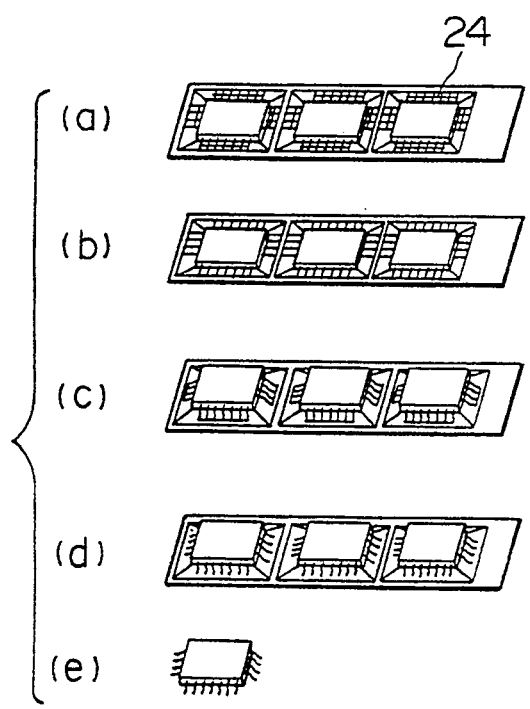
FIGS. 9(a) to 9(e) show a processing method for the semiconductor IC using the lead frame according to the second embodiment.
Figure 10:
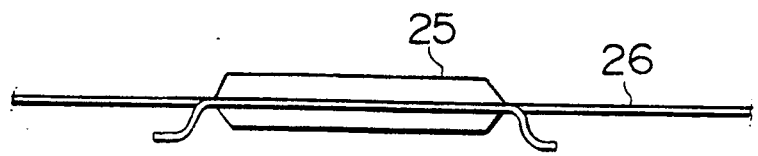
FIG. 10 is a side view showing a position relationship between a mold resin portion and a peripheral frame portion during the plating process.

FIGS. 9(a) to 9(c) respectively correspond to FIGS. 4(a) to 4(c), wherein the foregoing resin-cutting process, dambar-cutting process and bending process of the leads are respectively performed. Herein, FIG. 9(b) is somewhat different from FIG. 4(b) in terms when the plating process is carried out on the leads 22. In the second embodiment, the plating process is performed in the state of FIG. 9(c) where the bending process is completed. FIG. 10 is a sectional view showing the position relationship between the mold resin portion 25 and peripheral frame portion 26 at a point in time when the plating process is to be carried out. As shown in FIG. 10, the base-edge portion of the support-stay portion 30 is placed approximately in the same plane with the peripheral frame portion 26.

Next, as shown in FIG. 9(d), after effecting the plating process, the tie bar 23 is cut down, and the support-stay portion 30 is also cut down, so that the semiconductor IC is picked out (see FIG. 9(e)).

According to the above-mentioned steps of the processing method, it is possible to obtain the following effects.

① The plated layer is formed in accordance with the bent shape of the lead, so that flaws and cracks may be prevented from formation at the surface of the bent portion of the lead.

② It is possible to freely control the thickness of the plated layer at the lead. Thus, the plated thickness can also be controlled such that the plated thickness at the tip-edge portion of the lead becomes thicker than the plated thickness at its base-edge portion. ③

It is possible to freely control the component ratio of the soldering flux containing a substance Su—Pb. ④

In the above-mentioned processing method, it is possible to employ a gold-plating process, a rare-metal-plating process, and the like, other than the solder-plating process.

(3) Modifications

Figure 11:
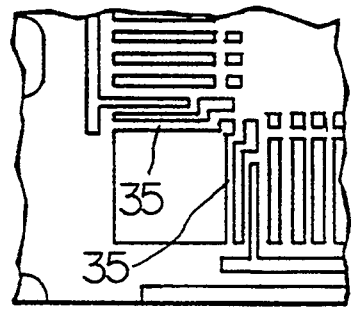
FIGS. 11 and 12 show modified examples of the second embodiment.
Figure 12:
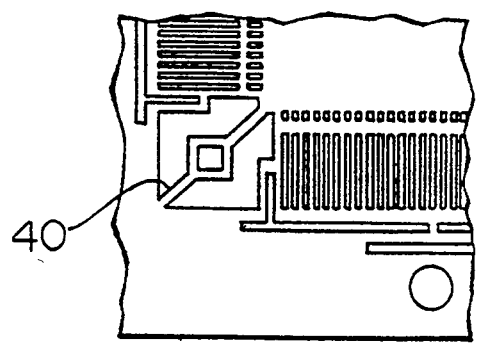

The second embodiment can be further modified as shown in FIGS. 11 and 12.

Figure 13:
FIG. 13 is a side view showing the lead frame according to a modified example of the second embodiment during the plating process.

In FIG. 11, support-stay portions 35 are placed along the leads 22 which are positioned at the corner portion of the mold resin portion 25. The tip-edge portion of the support-stay portion 35 is connected with the base-edge portion of its adjacent lead 22 at a position which is placed closer to the mold resin portion 25 than to the dam 24. According to this modification, and similarly to the foregoing construction of the second embodiment, the connection between the support-stay portion and the lead 22 can be maintained after effecting the bending process. FIG. 13 shows a position relationship between the peripheral frame and base-edge portion of the lead 22 after the bending process is carried out in this modification. As shown in FIG. 13, they are placed approximately in the same plane, and they are not separated from each other. Thus, it is possible to conduct a current through all of the leads 22 via the peripheral frame 26.

Figure 1:
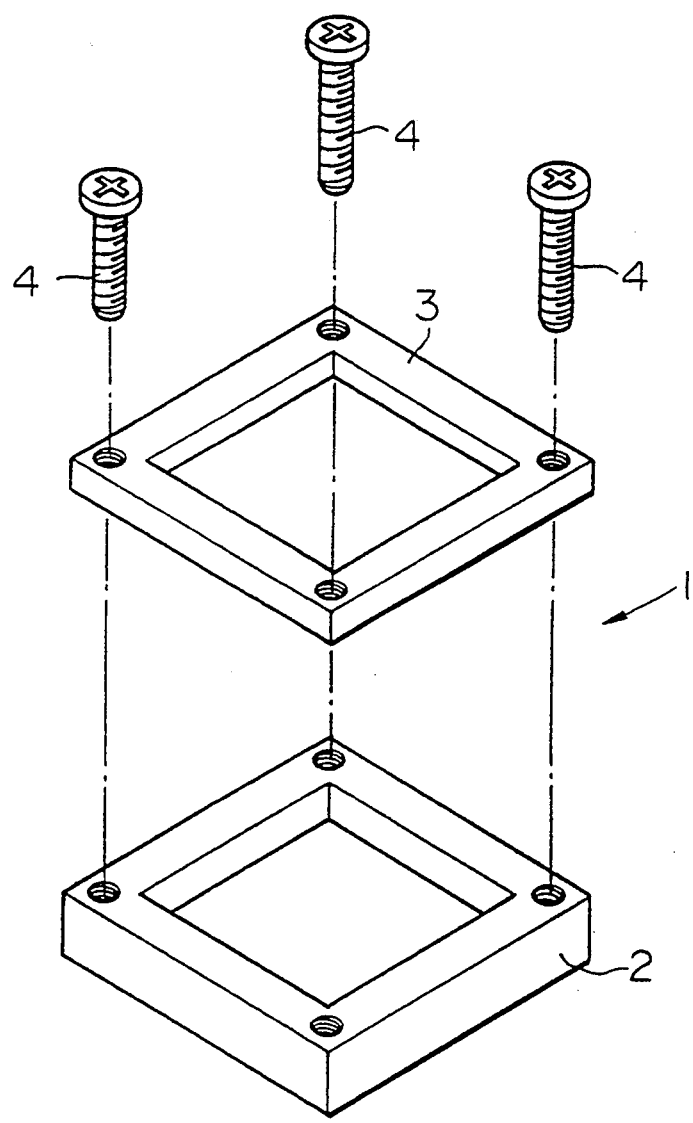
FIG. 1 is a perspective view illustrating a solder-plating tool which is used for a conventional lead frame.
Figure 2:
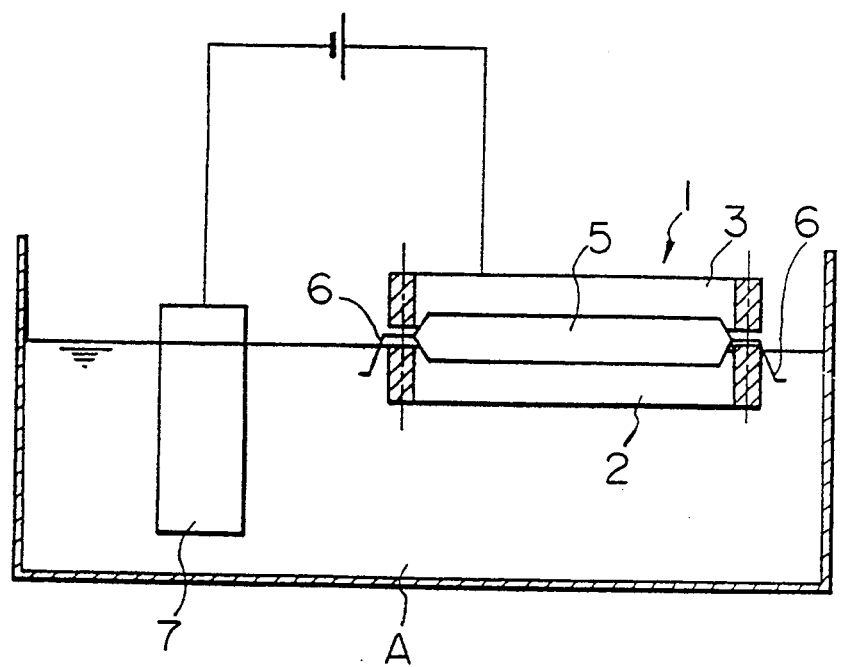
FIG. 2 is a sectional view for explaining the method of effecting the solder-plating process by use of the conventional solder-plating tool shown in FIG. 1.
Figure 3:
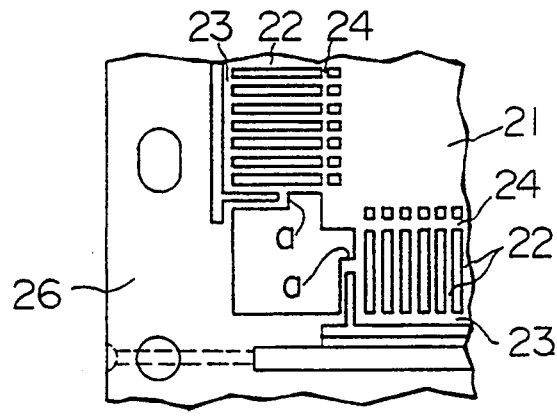
FIG. 3 is a plan view illustrating another example of a conventional lead frame.

In FIG. 12, as is similar to FIGS. 1 and 2, the base-edge portion of the support-stay portion has a V-shape. However, the center portion of the support-stay portion (see 40) is different from that of the foregoing one.

[C] Process of making lead frame

Figures 14, 15:
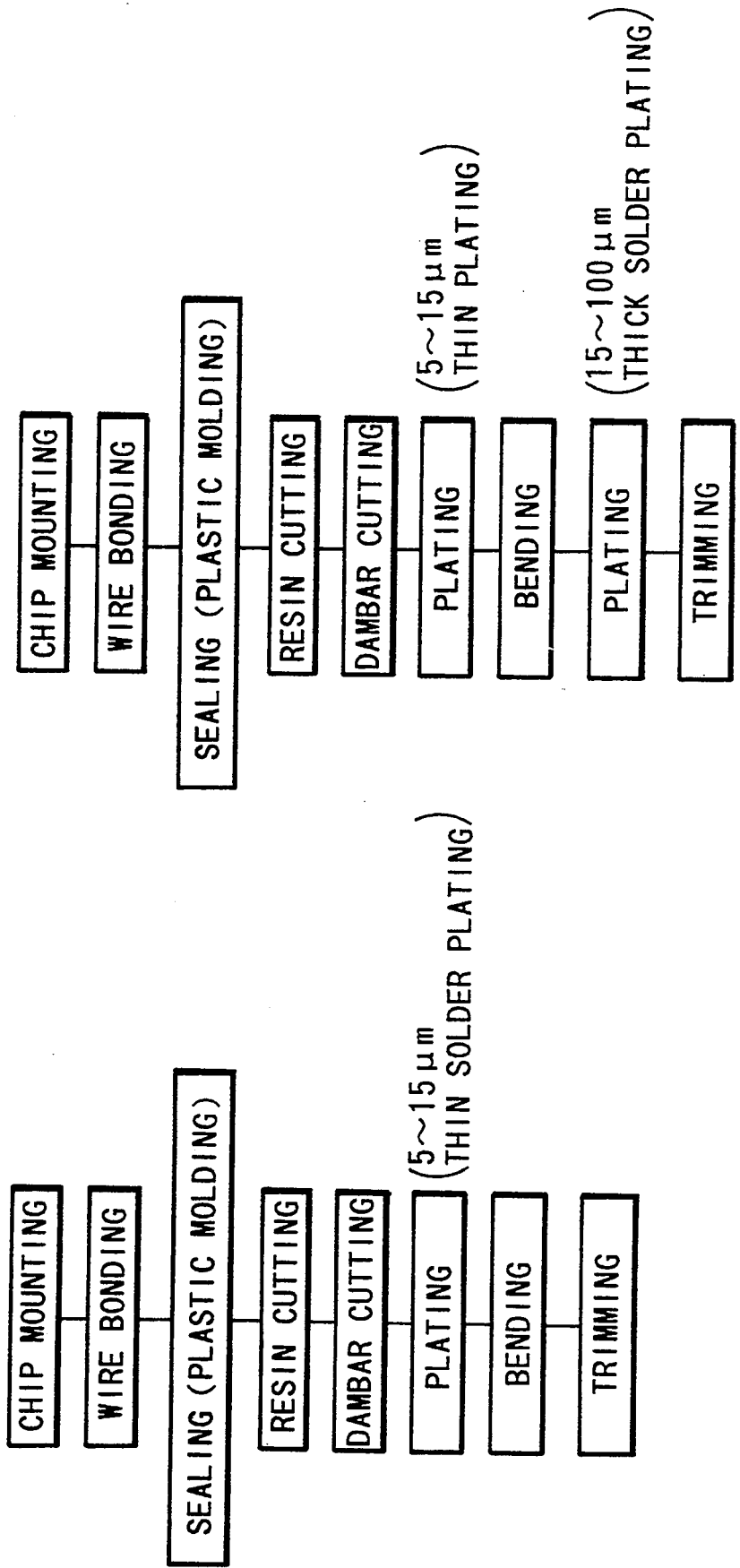
FIG. 14 shows a conventional process for making the lead frame.
FIGS. 15 and 16 show examples of processes for making the lead frame according to the present invention.
Figure 16:
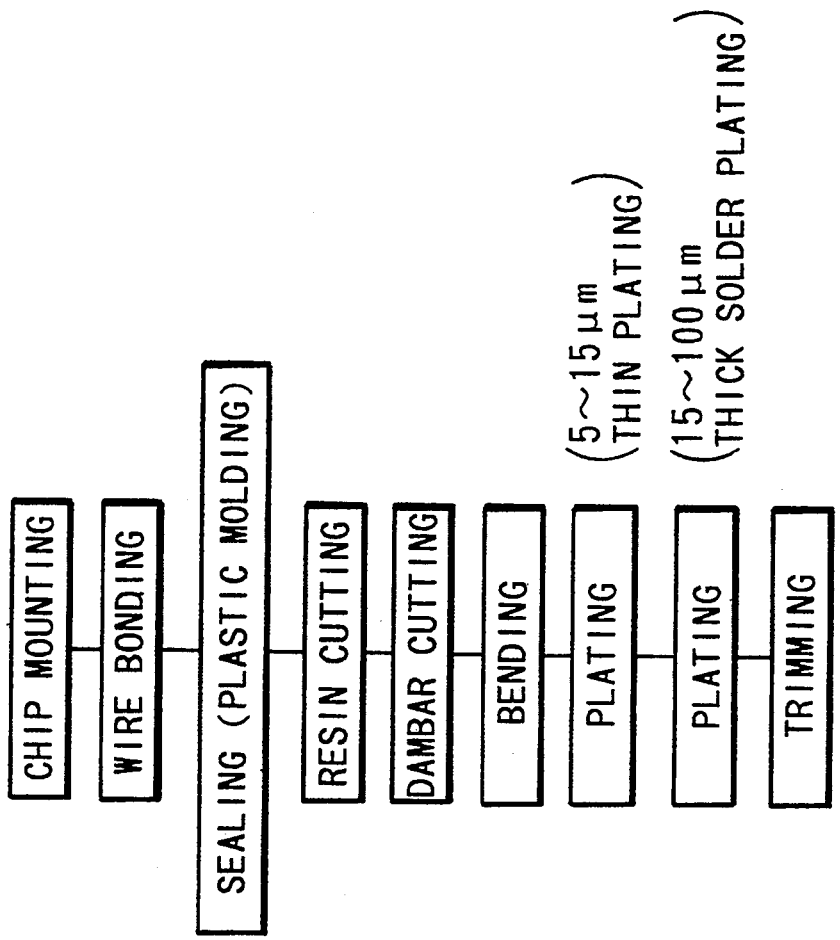

Next, the detailed description will be given with respect to the method of processing the above-mentioned lead frame according to the present invention. FIG. 14 shows a conventional process, while FIGS. 15 and 16 show two examples of the processes for making the lead frame according to the present invention.

As described before, each of the steps of the conventional process is performed In an order of an IC-chip mounting step, a wire-bonding step, a sealing step, a resin-cutting step, dambar-cutting step, a plating step, a bending step and a trimming step as shown In FIG. 14. Herein, the sealing step may correspond to the plastic molding process, and this process is carried out using a thermosetting plastic which encapsulates the semiconductor device using a transfer molding technique, for example. The resin-cutting process is carried out with the elimination of resin flashing in the vicinity of the dambars which result from resin bleed. The resin bleed is the seepage of the resin component of plastic molding compounds between the face of a plastic package encapsulation mold and the lead frame surface in contact with the mold. The resin flashing may affect the soldering or plating of the lead frame unless it is removed by chemical or media de-flashing. In the case of the present invention (see FIGS. 15 and 16), the resin-cutting step is effected by the downward movement of the tool (or punch) onto the frame adjacent to the dambar.

It is well known that the dambar is a known feature on lead frames for plastic molded packages which function to block or dam the flow of the plastic compound to the external lead areas of the lead frame during a molding cycle. Typical dambars electrically short the leads together and must therefore be removed or trimmed before electrical testing of the device can be performed, for example. So, the dambar-cutting step is accomplished by the downward movement of the tool to cut the dambar between adjacent pair of the leads.

In the plating step, a thin-solder plating process to 5–15 μ is carried out. In the next bending step, a lead frame (such as the frame 10 shown in FIG. 5) is bent using a tool and die arrangement so as to form the configuration shown in FIG. 7. With the frame 10 held in place over the die, the tool presses the leads 22 downwardly onto the surface of the die to provide the bent configuration shown In FIG. 7.

As compared to the conventional process shown in FIG. 14, a first example of the process according to the present invention is characterized by effecting a thick-solder plating process to 15–100 μm after the bending process is carried out. If the thick-solder plating is carried out before the bending process, cracks must be eventually formed. The present invention avoids such cracks by bending before the thick-solder plating is carried out.

Alternatively, it is possible to employ another process according to the present invention as shown In FIG. 16. In this process, the bending step is effected before both of the thin-solder plating step and thick-solder plating step are effected. In this example, the plating steps are effected after the bending step is effected, and consequently, the cracks can be prevented from being formed.

[D] Feature of lead frame

The lead frame according to the present invention is constructed to match with the aforementioned process of making it. In other words, the shape and position of the power supply portion of the lead frame (i.e., auxiliary leads and support-stay portion) is designed such that the bending step can be effected without any problems, and therefore, the plating step can be easily carried out after the bending step is carried out. Moreover, the lead frame is designed such that a so-called roller bending technique can be employed. This roller bending technique is advantageous in that the slipping can be avoided on the surface of the leads when bending the leads. In other words, this technique is effective in that the surface of the leads is not damaged when bending the leads. Further, as compared to a die bending technique, this roller bending technique is effective in that a spring-back amount can be reduced after bending the leads and a bent shape of the lead can be maintained with accuracy.

Next, the description will be given with respect to the reasons why the lead frame according to the present invention is constructed such that the support-stay portions at four corners of the IC package are used as the power supply portion, while the power is applied to the tie bar connecting the leads by means of the auxiliary leads which are not connected with the IC chip.

① There are provided no elements attached to one side of the tie bar (i.e., the outside portion of the tie bar), so that the leads can be bent with ease and with accuracy. If some elements are attached to the outside portion of the tie bar (which is disclosed in a reference Suzuki et al. given with a U.S. Pat. No.4,977,442), the tie bar must be deformed when bending the leads. This deteriorates the accuracy of the shapes of the leads to be bent. In contrast, the lead frame according to the present invention is designed such that the outside portion of the tie bar is free, so that the power supply using the tie bar can be carried out after bending the leads.

② Since the auxiliary leads are arranged at the edge portions of the leads at same spacing, it is possible to effect the thick-solder plating with accuracy such that the plated thickness for the leads can be made uniform even If the plated thickness for the auxiliary leads are not made uniform.

③ Conventionally, the plated thickness is made less than 10 μm. However, according to the present invention, it is possible to raise the plated thickness to be in a range of 15-200 μm, for example.

Lastly, this invention may be practiced or embodied in still other ways without departing from the spirit or essential character thereof as described heretofore. Therefore, the preferred embodiments described herein are illustrative and not restrictive, the scope of the invention being indicated by the appended claims and all variations which come within the meaning of the claims are intended to be embraced therein.

What is claimed is:

1. A method of making a lead frame comprising the steps of:

mounting an IC chip on a semiconductor-element-mounting portion of the lead frame having a plurality of leads extending therefrom and a plurality of auxiliary leads associated with said plurality of leads;

effecting a wire-bonding process on said lead frame;

sealing said lead frame with a thermosetting plastic;

effecting a resin-cutting process on said lead frame so as to partially remove a resin plastic from said lead frame;

effecting a dambar-cutting process so as to cut down a dambar which is provided and connected among said leads;

effecting a bending process on said plurality of leads;

effecting a plating process using a predetermined material on said plurality of leads so as to form a plated layer on each of said plurality of leads after effecting said bending process; and effecting a trimming process on said leads.

2. A method of making a lead frame as recited in claim 1 wherein said predetermined material used in said plating process is soldering flux so that a solder-plated layer is formed on each of said leads.

3. A method of making a lead frame as recited In claim 1 wherein said plated layer formed on each of said leads is controlled such that a thickness of said plated layer is made uniform with respect all of said leads.

4. A method of making a lead frame as recited in claim 1 wherein said predetermined material used in said plating process is soldering flux and a thickness of a solder-plated layer formed on each of said leads is controlled to be in a range of 15 μm to 100 μm.

5. A method of making a lead frame comprising the steps of:

mounting an IC chip on a semiconductor-element-mounting portion of the lead frame having a plurality of leads extending therefrom and a plurality of auxiliary leads associated with said plurality of leads;

effecting a wire-bonding process on said lead frame;

sealing said lead frame with a thermosetting plastic;

effecting a resin-cutting process on said lead frame so as to partially remove a resin plastic from said lead frame;

effecting a dambar-cutting process so as to cut down a dambar which is provided and connected among said leads;

effecting a thin-plating process so as to form a thin-plated layer on each of said leads after effecting said dambar-cutting process;

effecting a bending process on said plurality of leads after effecting said thin-plating process;

effecting a thick-plating process on said plurality of leads so as to form a thick-plated layer on each of said plurality of leads after effecting said bending process; and effecting a trimming process on said leads.

6. A method of making a lead frame as recited in claim 5 wherein a thickness of said thin-plated layer is set in a range of 5 μm to 15 μm, while a thickness of said thick-plated layer is set in a range of 15 μm to 100 μm.

7. A method of making a lead frame comprising the steps of:

mounting an IC chip on a semiconductor-element-mounting portion of the lead frame having a plurality of leads extending therefrom and a plurality of auxiliary leads associated with said plurality of leads;

effecting a wire-bonding process on said lead frame;

sealing said lead frame with a thermosetting plastic;

effecting a resin-cutting process on said lead frame so as to partially remove a resin plastic from said lead frame;

effecting a dambar-cutting process so as to cut down a dambar which is provided and connected among said leads;

effecting a bending process on said plurality of leads;

effecting a thin-plating process so as to form a thin-plated layer on each of said leads after effecting said bending process;

effecting a thick-plating process on said plurality of leads so as to form a thick-plated layer on each of said plurality of leads after effecting said thin-plating process; and effecting a trimming process on said leads.

8. A method of making a lead frame as recited in claim 7 wherein a thickness of said thin-plated layer is set in a range of 5 μm to 15 μm, while a thickness of said thick-plated layer is set in a range of 15 μm to 100 μm.

* * * * *